US010433467B2

(12) United States Patent
Hurbi et al.

(10) Patent No.: US 10,433,467 B2
(45) Date of Patent: Oct. 1, 2019

(54) THERMAL DISSIPATION SYSTEM FOR WEARABLE ELECTRONIC DEVICES

(71) Applicant: MICROSOFT TECHNOLOGY LICENSING, LLC, Redmond, WA (US)

(72) Inventors: Erin Hurbi, San Francisco, CA (US); Michael Nikkhoo, Saratoga, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 141 days.

(21) Appl. No.: 15/629,550

(22) Filed: Jun. 21, 2017

(65) Prior Publication Data

US 2018/0376626 A1    Dec. 27, 2018

(51) Int. Cl.
*H05K 7/20*    (2006.01)
*G02B 27/01*    (2006.01)

(52) U.S. Cl.
CPC ..... *H05K 7/20963* (2013.01); *G02B 27/0176* (2013.01); *H05K 7/2099* (2013.01)

(58) Field of Classification Search
CPC ............. H05K 7/20963; H05K 7/2099; H05K 1/0206; H05K 1/115; G06F 1/163; G06F 1/1652; G02B 27/0176
See application file for complete search history.

(56) References Cited

U.S. PATENT DOCUMENTS

| | | | |
|---|---|---|---|
| 5,970,718 A * | 10/1999 | Arnold | A61F 7/10 607/109 |
| 6,282,089 B1 | 8/2001 | Nakanishi et al. | |
| 6,359,841 B1 * | 3/2002 | Kotanagi | G04C 10/00 136/205 |
| 8,087,254 B2 | 1/2012 | Arnold | |
| 8,946,561 B2 | 2/2015 | Wurzel et al. | |
| 9,456,529 B2 | 9/2016 | Cavallaro et al. | |
| 2005/0270746 A1 | 12/2005 | Reis | |
| 2010/0198322 A1 * | 8/2010 | Joseph | A61F 7/007 607/108 |

(Continued)

OTHER PUBLICATIONS

Amon, Cristina H., "Thermal design of wearable computers: application to the Navigator 2, thermal management devices, and embedded electronics", http://citeseerx.ist.psu.edu/viewdoc/download?doi=10.1.1.1015.6199&rep=rep1&type=pdf, Published on: 1995, 62 pages.

*Primary Examiner* — Melvin Jones
(74) *Attorney, Agent, or Firm* — Newport IP, LLC; Mike R. Cicero

(57) ABSTRACT

A thermal dissipation system for wearable electronic devices transfers heat away from a housing enclosing a heat source and dissipates the heat through a region of the support assembly that is noncontiguous with the housing. The support assembly may be coupled to the housing to enable the housing to be worn by a user. Various regions of the support assembly have different thermal resistances between a thermal conduit and an ambient environment. The thermal resistances may decrease as the thermal conduit becomes farther away from the heat source. The variations in thermal resistances enable modulation of relative heat flux between the various regions. For example, heat may be internally routed through the wearable electronic device to be dissipated through a surface that a user does not typically touch during operation.

20 Claims, 4 Drawing Sheets

(56) References Cited

U.S. PATENT DOCUMENTS

| | | | |
|---|---|---|---|
| 2014/0299169 A1* | 10/2014 | Schneider | H01L 35/02 136/201 |
| 2014/0362590 A1* | 12/2014 | Chen | H05K 1/0206 362/373 |
| 2015/0029661 A1 | 1/2015 | Huang et al. | |
| 2017/0017279 A1 | 1/2017 | Saeidi et al. | |

\* cited by examiner

THERMAL DISSIPATION SYSTEM FOR WEARABLE ELECTRONIC DEVICES

BACKGROUND

Thermal management is a key consideration in the design of wearable electronic devices such as head-mounted display (HMD) devices, watches, or any other device that is designed to be worn by an individual during operation. Thermal dissipation capacity for wearable electronic devices presents unique challenges due to the limited area of the surfaces available to dissipate heat. For example, in wearable electronic devices that include a housing enclosing heat-emitting components, the housing itself may have insufficient surface area to remain at or below an allowable surface temperature while passively dissipating the full amount of the heat generated by the electronic components.

These design challenges may be exacerbated under various circumstances, such as when a housing that encloses heat generating electronic components is likely to come into contact with a user's skin. For example, HMD devices often include a display assembly that includes electronic components that emit substantial amounts of heat while also including a display component that must be positioned toward the front of the user's head in order to effectively generate images that are visible to the user. Due to being positioned toward the front of the user's head, such display assemblies can be natural grab points for the user when putting-on or taking-off the HMD device. The grab points may not always be optimal surfaces for thermal dissipation. Thus, available surface area on HMD devices can be further limited. Such issues present additional design challenges.

It is with respect to these and other considerations that the disclosure made herein is presented.

SUMMARY

Technologies described herein provide a thermal dissipation system for wearable electronic devices. Generally described, the techniques disclosed herein enable a thermal dissipation system to transfer heat away from a housing that encloses heat emitting electronic components and into a support assembly, coupled to the housing, to dissipate the heat through a region of the support assembly that is noncontiguous with the housing. Unlike conventional wearable device thermal dissipation systems, the systems and techniques described herein are not limited to dissipating heat into an ambient environment through an electronic component housing and/or heat dissipation structures that are contiguous with the electronic component housing. In particular, the techniques described herein enable regions of a wearable electronic device that are noncontiguous with one or more heat sources to be utilized to dissipate heat emitted from those heat sources.

In some configurations, a thermal dissipation system comprises a housing that at least partially encloses a heat source such as, for example, processors and/or batteries that emit heat during operation. The thermal dissipation system may also comprise a support structure that is configured to maintain the housing at a particular position with respect to a body part of a user during operation. Stated alternatively, the support structure may be coupled to the housing to enable the housing to be worn by the user. For example, in an implementation in which the thermal dissipation system is used to dissipate heat from an HMD device, the support structure may be configured to be worn on the user's head. In an alternate implementation in which the thermal dissipation system is used to dissipate heat from a smart watch, the support structure may be configured to be worn on the user's wrist.

The thermal dissipation system may further comprise a thermal conduit that is positioned to absorb heat emitted by the heat source within the housing and to transfer at least a portion of the heat away from the housing and through a plurality of regions of the support structure. Exemplary thermal conduits include various highly thermally conductive metal foils, graphite fibers, flexible vapor chambers, and/or any other material and/or device suitable for efficiently transferring heat from one location to another location at which the heat is dissipated into an ambient environment.

Various regions of the support structure have different thermal resistances between the thermal conduit and an ambient environment. In some configurations, the thermal resistances between the thermal conduit and the ambient environment may decrease as the thermal conduit becomes further removed from the heat source. For illustrative purposes, suppose that the support structure includes a first region that has a first thermal resistance between the thermal conduit and the ambient environment and a second region that has a second thermal resistance between the thermal conduit and the ambient environment. In this example, the first region may be positioned between the heat source and the second region such that the second region is noncontiguous with the heat source. Furthermore, the second thermal resistance may be less than the first thermal resistance. Under these circumstances, if the thermal conduit remains substantially constant in temperature between the first region and the second region (e.g., due to the thermal conduit being a sufficiently sized vapor chamber that maintains a substantially uniform internal temperature), the heat flux through the first region will be less than the heat flux through the second region.

In some configurations, the different thermal resistances may result from the support structure being comprised of a material that varies in thickness across the various regions such that a heat path distance (e.g., the distance that thermal energy must travel from the thermal conduit through the material before reaching the ambient environment) is not constant between the various regions. For example, the thickness of the material between the thermal conduit and the ambient environment may be greater at a first region that is relatively closer to the heat source rather than at a second region that is relatively farther away from the heat source than the first region.

In some configurations, the different thermal resistances may result from various regions of the support structure including two or more types of materials that have different thermal conductivities. As a specific but nonlimiting example, the first region may include (e.g., between the thermal conduit and the ambient environment) a layer of thermally insulative plastic that has a thermal conductivity on the order of one (1) watt per meter-kelvin (W/(m·K)) whereas the second region may include a layer of thermally conductive metal that has a thermal conductivity on the order of two-hundred (200) watts per meter-kelvin (W/(m·K)). In some configurations, the thermal dissipation system may include a heat sink that is positioned within the second region to efficiently transfer heat from the thermal conduit to the ambient environment. Exemplary heat sinks may include geometrical features such as, for example, fins, pins, and/or indentations that are configured to maximize a surface area of the heat sink that is in contact with the ambient environment (e.g., to maximize convective heat transfer at a boundary between the heat sink and the ambient environment).

These and various other features will be apparent from a reading of the following Detailed Description and a review of the associated drawings. This Summary is provided to introduce a selection of concepts in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DRAWINGS

The Detailed Description is described with reference to the accompanying figures. In the figures, the left-most digit(s) of a reference number identifies the figure in which the reference number first appears. The same reference numbers in different figures indicate similar or identical items. References made to individual items of a plurality of items can use a reference number with another number included within a parenthetical (and/or a letter without a parenthetical) to refer to each individual item. Generic references to the items may use the specific reference number without the sequence of letters.

DETAILED DESCRIPTION

The following Detailed Description describes technologies for providing a thermal dissipation system that can efficiently dissipate heat from various types of wearable electronic devices such as, for example, head-mounted display (HMD) devices. Generally described, the techniques disclosed herein enable a thermal dissipation system to transfer heat out of a housing that encloses heat emitting components (e.g., electronics) into a support assembly and, ultimately, to dissipate the heat through a region of the support assembly that is noncontiguous with the housing. The techniques described herein provide benefits over conventional wearable device thermal dissipation systems for at least the reason that the disclosed system is not limited to dissipating heat through electronic component housings and/or heat dissipation structures that are directly contiguous with such electronic component housings. Rather, by deploying the techniques described herein, regions of a wearable electronic device that are noncontiguous with one or more heat sources may be utilized to dissipate heat emitted from those heat sources.

Figure 1:
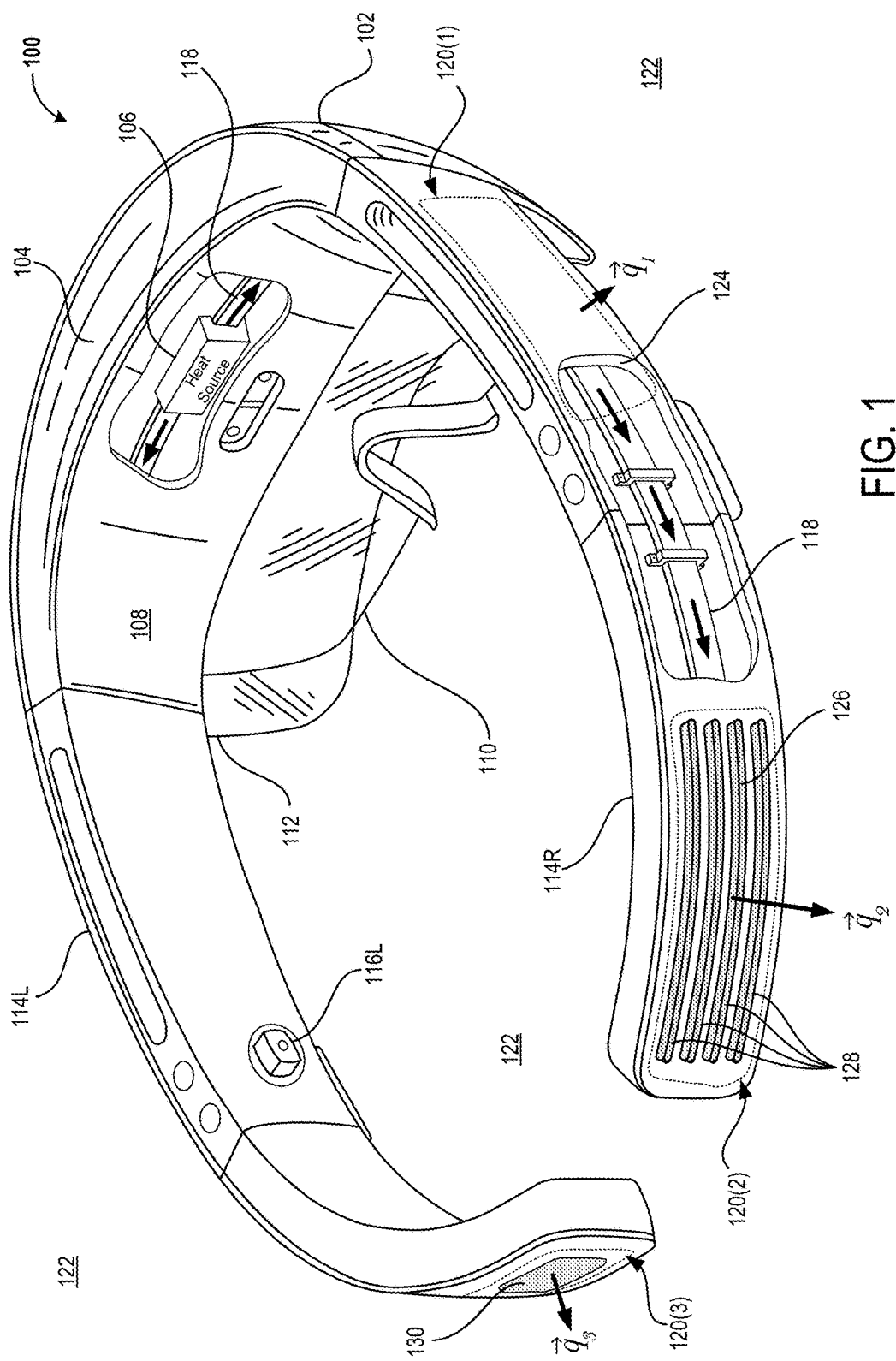
FIG. 1 is a rear perspective view of an exemplary embodiment of a thermal dissipation system that is configured within a wearable electronic device and, more specifically, a head-mounted display (HMD) device.

FIG. 1 is a rear perspective view of an exemplary thermal dissipation system 100 that is configured within an HMD device 102. In this example, the thermal dissipation system 100 may include a housing 104 that at least partially encloses a heat source 106 such as, for example, a central processing unit, a graphics processing unit, and/or a battery. In some configurations, the housing 104 may be a component of a display assembly 108 that includes a display component 110 configured to generate images in front of a user's eye(s). For example, the HMD device 102 can be used for augmented reality (AR) and/or virtual reality (VR) applications. In implementations where the HMD device 102 is an AR HMD device, the display component 110 may be a transparent display element that enables the user to see concurrently both the real-world environment surrounding her as well as AR content generated by the display component 110. The HMD device 102 may further include a visor 112 that is configured to protect one or both of the user's eyes and/or the display component 110 when the HMD device 102 is being worn by the user during operation.

The thermal dissipation system 100 may further include a support structure 114 that is coupled to the housing 104. The support structure 114 may be configured to maintain a position of the housing 104 with respect to a body part of a user that is wearing the thermal dissipation system 100. Stated alternatively, the support structure 114 may enable the thermal dissipation system 100 to be worn by the user. As illustrated, the thermal dissipation system 100 includes a left support structure 114L and a right support structure 114R that together enable the HMD device 102 to be worn on the head of the user. In some implementations, the support structure 114 may be indirectly coupled to the body part of the user when the thermal dissipation system 100 is being worn. For example, the support structure 114 may include one or more mounts 116 (a left mount 116L is shown whereas a right mount 116R is not shown) onto which one or more head straps (not shown) may be coupled. In such implementations, the head straps may be directly coupled to the head of the user while the support structure 114 may be directly coupled to the head straps such that the user's head is indirectly coupled to the support structure 114 via the head straps. In some such embodiments, the support structure 114 may not be in direct contact with the body part. As described in more detail elsewhere herein, in other implementations the support structure 114 may be directly coupled to the body part of the user when the thermal dissipation system 100 is being worn. For example, the support structure 114 may include temple-arms 202 (shown in FIG. 2) that are configured to extend at least partially over the ears of a user to maintain the housing 104 and/or display assembly 108 at an optimal position with respect to the user's eye(s). As another example, the support structure 114 may include flexible straps 302 (shown in FIG. 3) that are configured to wrap around a user's head to maintain the housing 104 and/or display assembly 108 at the optimal position.

The thermal dissipation system 100 may further include a thermal conduit 118 that is configured to absorb heat that is emitted by the heat source 106 and to transmit at least a portion of the absorbed heat through various regions 120 of the support structure 114. It can be appreciated that the thermal conduit 118 and the heat source 106 may be embedded and/or enclosed within the housing 104 and the support structure 114 and, therefore, would not ordinarily be visible. Accordingly, FIG. 1 includes two cutaway portions through which one or both of the heat source 106 and the thermal conduit 118 are visible. In particular, a portion of the housing 104 is cut away such that the heat source 106 and a first segment of the thermal conduit 118 are visible and a portion of the right support structure 114R is cut away such that a second segment of the thermal conduit 118 is visible. As illustrated, the right support structure 114(R) includes a first region 120(1) and a second region 120(2) that is farther away from the heat source 106 than the first region 120(1). Each discrete region is outlined with a dotted line. The various regions of the support structure 114 may be configured to have different thermal resistances between the thermal conduit 118 and an ambient environment 122 (e.g., ambient air).

As used herein, the term "thermal resistance" refers generally to an "absolute" thermal resistance. In various examples, thermal resistance is measured from the thermal conduit 118 through one or more physical components at a particular region of the support structure 114 and, ultimately, to the ambient environment 122. Accordingly, it can be appreciated that the thermal resistance of a particular region is a function of the thermal conductivity (e.g., a material property) and the material thickness of one or more components included within that particular region. It can further be appreciated that the thermal resistance of a particular region may be measured in terms of degrees kelvin per watt (K/W) whereas the thermal conductivity of a particular material may be measured in terms of watts per meter-kelvin (W/(m·K)).

In some embodiments, the support structure 114 may include two or more regions having thermal resistances that vary (e.g., decrease) as the thermal conduit 118 moves further away from the heat source 106 such that the relative heat flux $\vec{q}$ (W/m²) at the various regions is modulated according to design considerations such as, for example, which surfaces are optimal for thermal dissipation purposes. For example, the first region 120(1) may be configured with a first thermal resistance whereas the second region 120(2) may be configured with a second thermal resistance that is different than the first thermal resistance. In some implementations, the first thermal resistance may be higher than the second thermal resistance such that a first heat flux $\vec{q}_1$ that corresponds to the first region 120(1) is lower than a second heat flux $\vec{q}_2$ that corresponds to the second region 120(2). For example, at the first region 120(1) the support structure 114 may include one or more thermally insulative materials (e.g., a material with a low thermal conductivity relative to one or more other regions) to thermally insulate the thermal conduit 118 from the ambient environment 122 whereas at the second region 120(2) the support structure 114 may include one or more thermally conductive materials (e.g., a material with a high thermal conductivity relative to one or more other regions) to facilitate heat transfer from the thermal conduit 118 to the ambient environment 122. As illustrated, the first region 120(1) includes a wall 124 that is between the thermal conduit 118 and the ambient environment 122 whereas the second region 120(2) includes a heat sink 126 that is between the thermal conduit 118 and the ambient environment 122. In various implementations, the heat sink 126 may be made of a second material that has a relatively high thermal conductivity compared to a first material that is used for the wall 124 and/or various other components of the support structure 114. Furthermore, the heat sink 126 may include one or more features that are designed to maximize an amount of surface area that is in contact with the ambient environment 122. For example, as illustrated, the heat sink 126 includes a plurality of fins 128 to facilitate convective heat transfer.

In some embodiments, variations of thermal resistances between the different regions of the support structure 114 may result from material properties alone rather than geometrical features designed to maximize a surface area in contact with the ambient environment 122 (such as the fins 128 shown at the second region 120(2).) For example, in the illustrated embodiment, the support structure 114 also includes a third region 120(3) at an end of the left support structure 114L. Here, the third region 120(3) includes a heat sink 130 having different geometrical characteristics than the heat sink 126. In particular, the heat sink 130 includes an outer surface that substantially matches an outer profile of the left support structure 114L. The heat sink 130 is, however, made from a material that has a relatively high thermal conductivity as compared to the rest of the left support structure 114L. As a specific but nonlimiting example, the support structure 114 may be made from injection molded acrylonitrile butadiene styrene (ABS) thermoplastic polymer having a thermal conductivity of 0.1 W/(m·K) and the heat sink 130 (and/or heat sink 126) may be made from aluminum having a thermal conductivity of 205 W/(m·K).

In some implementations, the heat sink 126 may include a specific surface treatment to modulate (increase/decrease) an emissivity of the second region 120(2). For example, the heat sink 126 may be made from aluminum due to the material's lightweight and high thermal conductivity and the heat sink 126 may further be anodized to maximize the material's emissivity and, therefore, to maximize heat transfer through radiation at the second region 120(2). In some implementations, the first region 120(1) may include a specific surface treatment to modulate an emissivity.

In some configurations, there may be variations of thermal resistances between the different regions of the support structure 114. These thermal resistances may result from the support structure 114 including one or more materials that vary in thickness across the various regions such that the heat path distance (e.g. the distance through the support structure's material(s) that heat must travel from the thermal conduit before reaching the ambient environment) is not constant across the various regions. For example, the thickness of the wall 124 that is between the thermal conduit 118 and the ambient environment 122 may be greater at the first region 120(1) than at the second region 120(2) that is relatively farther away from the heat source 106 than the first region 120(1).

In some embodiments, the thermal conduit 118 may be constructed of a heat pipe and/or flexible vapor chamber used to transfer heat from the heat source 106 to the heat sink 126 and/or the heat sink 130 via convective heat transfer (also referred to herein as convection). For example, the thermal conduit 118 may enclose a bi-phase fluid that is evaporated, from a liquid into a gas, within a segment of the thermal conduit 118 that is positioned adjacent to the heat source 106. The evaporated gas may then flow within the thermal conduit 118 through the first region 120(1) of the support structure 114 to the second region 120(2) and/or to the third region 120(3), at which thermal energy is dissipated into the ambient environment 122 through the heat sink 126 and/or heat sink 130. Here, as the bi-phase fluid releases the latent heat that was absorbed from the heat source 106, the evaporated gas re-condenses into a liquid and ultimately flows back through the first region 120(1) to the segment of the thermal conduit 118 that is adjacent to the heat source 106 at which the liquid may be re-evaporated. In some embodiments, one or more internal walls of the thermal conduit may include a wicking structure to exert a capillary action on the condensed liquid and ultimately to assist in drawing the condensed liquid back to the first segment of the thermal conduit 118. Exemplary wicking structures include, but are not limited to, sintered metal powders, screens, and/or grooved wicks having a series of grooves that run from the segment of the thermal conduit 118 that is adjacent to the heat sink 126 to the segment of the thermal conduit that is adjacent to the heat source 106.

In FIG. 1 each region of the support structure 114 that is expressly labeled (i.e., the first region 120(1), the second region 120(2), and the third region 120(3)) is illustrated along with a corresponding heat flux vector. The relative length of the illustrated heat flux vectors is representative of the relative magnitude of each corresponding heat flux. In particular, in the illustrated embodiment the second heat flux $\vec{q}_2$ is greater than the third heat flux $\vec{q}_3$ which is greater than the first heat flux $\vec{q}_1$. Accordingly, in various implementations the support structure 114 may be specifically designed to dissipate heat generated by the heat source 106 at a highest rate from a region of the support structure 114 that is noncontiguous with the housing 104 and/or the display assembly 108.

It can be appreciated that ergonomic considerations may warrant designing the support structure 114 to dissipate heat through a region that is noncontiguous with and even distant from the housing 104. For example, when taking off and/or putting on the illustrated HMD device 102, a user may be more likely to physically grasp the housing 104 and/or the first region 120(1) of the support structure 114 than the second region 120(2) and/or third region 120(3) of the support structure 114. Accordingly, to reduce the likelihood of a user physically grasping a surface of the HMD device 102 (or, for that matter, any other type of wearable electronic device) that is warm or even hot to the touch, the thermal dissipation system 100 described herein enables thermal energy to be efficiently routed to and dissipated through those regions of the device 102 that are the least likely to be grasped.

Figure 2A:
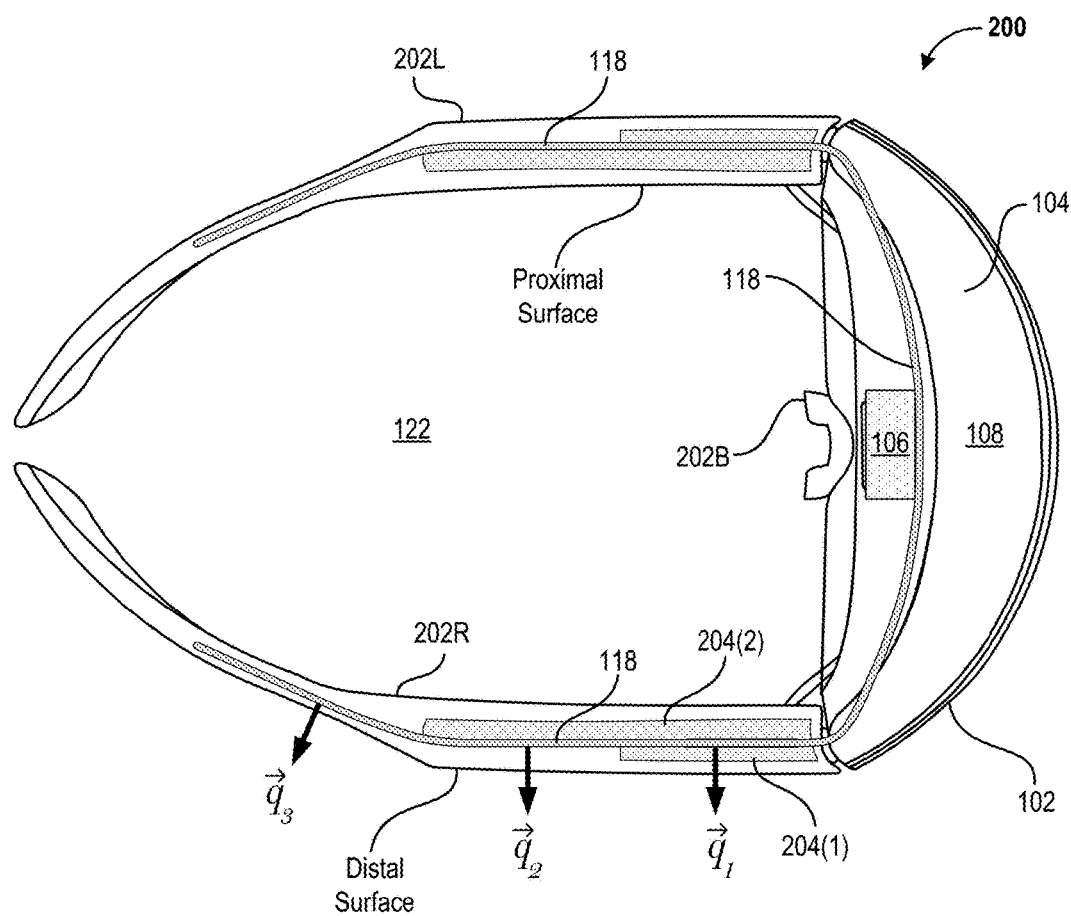
FIG. 2A is a top view of an alternate embodiment of a thermal dissipation system that is configured within a wearable electronic device.
Figure 2B:
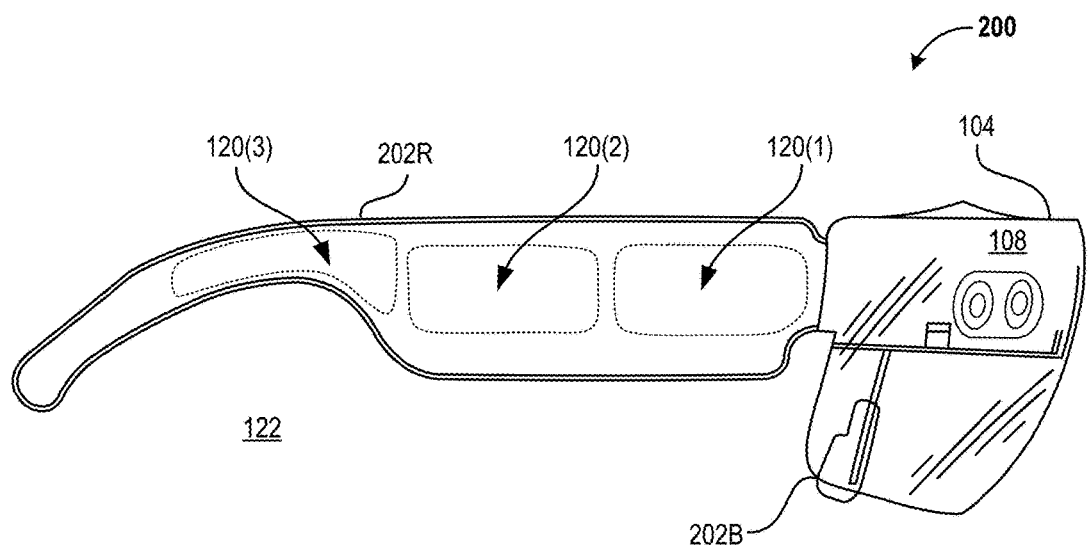
FIG. 2B is a side view of the alternate embodiment of the thermal dissipation system of FIG. 2A.

Turning now to FIGS. 2A and 2B, illustrated are alternate embodiments of a thermal dissipation system 200 that is configured within an HMD device 102. FIG. 2A is a top view of the thermal dissipation system 200 and FIG. 2B is a side view of the thermal dissipation 200. As illustrated, the thermal dissipation system 200 includes a support structure 202 that is configured to mount the HMD device 102 directly to the head of the user. Here, the support structure 202 includes a right temple-arm 202R and a left temple-arm 202L that are each configured to extend at least partially over the ears of the user to maintain a housing 104 and/or display assembly 108 at an optimal position with respect to the user's eye(s). The support structure 202 further includes a bridge 202B that is configured to provide support while resting on the user's nose.

In the illustrated embodiment, a segment of the thermal conduit 118 is positioned adjacent to the heat source 106 to absorb heat emitted by the heat source 106 during operation. The thermal conduit 118 includes one or more other segments that extend at least partially through the temple-arm(s) 202R and/or 202L to transmit heat through various regions 120 (shown on FIG. 2B) of the support structure 202. Ultimately, the heat is dissipated through the various regions 120 at rates that are modulated according to various design considerations.

In some embodiments, one or more layers of insulation 204 are embedded within the support structure 202 in order to increase the thermal resistance between the thermal conduit 118 and the ambient environment 122 at one or more regions 120. For purposes of the present discussion, the support structure 202 includes both "distal" regions and "proximal" regions. As used herein, distal regions are regions of the support structure(s) that are situated between the thermal conduit 118 and a distal surface of the support structure 202 (i.e., a surface that is situated away from the user's body when the device is worn). As used herein, proximal regions are regions situated between the thermal conduit 118 and a proximal surface of the support structure 202 (i.e., a surface that is situated toward the user's body when the device is worn). For example, the illustrated embodiment includes a first insulation layer 204(1) that is embedded within the support structure 202R at a distal region and also a second insulation layer 204(2) that is embedded within the support structure 202R at a proximal region. For purposes of the present discussion, assume that each of the regions that are labeled 120 in FIG. 2B are distal regions that are disposed between the thermal conduit 118 and the distal surface of the support structure 202.

In some embodiments, during operation of the HMD device 102, the temperature of the thermal conduit 118 may progressively decrease as the thermal conduit 118 moves further from the heat source 106. For example, in some implementations the thermal conduit 118 may transfer heat mainly (or exclusively) through conductive heat transfer, e.g. the thermal conduit may be a conductive heat spreader. In such embodiments, because thermal energy escapes through successive regions of the support structure 202, the temperature of the thermal conduit 118 may decrease in relation to a distance from the heat source 106. As a more specific but nonlimiting example, the thermal conduit 118 may be made up of one or more layers of thin, flat, thermally conductive material, such as flexible graphite or very thin metal. For example, the flexible conduit 118 may be made of one or more layers of, for example, eGRAF® SPREADER-SHIELD™ SS500 Graphite, from GrafTech International. In some embodiments, the thermal conduit 118 may consist of only a single layer, e.g. a single piece of thermally conductive and flexible plastic. In some embodiments, the thermal conduit 118 may be made of a material other than graphite, such as a substrate loaded with graphing, or a thin layer of metal such as copper. In some embodiments, the thermal conduit 118 may be an anisotropic thermal spreader that transfers heat, at the first region 120(1), more easily in a direction toward the second region 120(2) and/or third region 120(3) than out of the thermal conduit 118 at the first region 120(1).

In some embodiments, the support structure 202 may include a plurality of regions 120 having thermal resistances which progressively decrease as the regions are positioned progressively further from the housing 104. For example, with reference to FIG. 2B, the right support structure 202R may include a first region 120(1), a second region 120(2), and a third region 120(3) where each successive region is positioned progressively further from the housing 104 (and therefore the heat source 106) than the previous region(s), and where each successive region has a thermal resistance that is less than the previous region(s).

In some embodiments, the thermal resistances of the individual regions 120 may be selected to maintain one or more surfaces of the support structure 202 at or below a predetermined surface temperature (e.g., 48 Celsius, 44 Celsius, or any suitable temperature that is safe and/or comfortable for direct contact with the user's skin), based on a predetermined thermal output of the heat source 106 and predetermined conditions of the ambient environment 122. For example, the predetermined thermal output of the heat source 106 may be selected as a maximum BTU/hour output of one or more electronic components enclosed within the housing 104 during normal operation of the HMD device 102. Furthermore, the predetermined conditions of the ambient environment 122 may include assumptions that the ambient environment is comprised of still air at a particular temperature (e.g., 25 Celsius) and a particular humidity (e.g., 50%).

In embodiments where the temperature of the thermal conduit 118 progressively decreases as the thermal conduit 118 moves further from the heat source 106 (e.g., where the thermal conduit 118 transfers heat mainly through conductive heat transfer such that its temperature is highest at the heat source 106 and lowest at a point furthest from the heat source 106), the thermal resistances of the individual regions 120 may be selected to maintain a substantially constant average heat flux across the various regions even as the temperature of the thermal conduit 118 decreases further from the heat source 106. For example, as illustrated, the magnitude of the heat flux vectors illustrated are substantially constant across each of the first region 120(1), the second region 120(2), and the third region 120(3) even though the thermal resistances of each region progressively decrease from the previous region.

In some embodiments, the thermal resistances of the individual regions 120 may be selected (e.g., based on the predetermined thermal output of the heat source 106, the predetermined conditions of the ambient environment 122, and/or thermal characteristics of the thermal conduit 118) such that an average surface temperature across the various regions remains substantially constant. For example, the thermal conduit 118 may transfer heat away from the heat source through the regions 120. Here, the thermal conduit 118 may be a first temperature within the first region 120(1) and the first region 120(1) may have a first thermal resistance that results in the distal surface of the support structure at the first region 120(1) being a particular surface temperature. Due to a portion of the heat being dissipated at the first region 120(1), within the second region 120(2) the thermal conduit 118 may be a second temperature that is less than the first temperature. The second region 120(2) may have a second thermal resistance that is less than the first thermal resistance and that results in the distal surface of the support structure at the second region 120(2) being the same particular surface temperature as at the first region 120(1). Stated alternatively, in some embodiments the internal temperature of the support structure 114 and the thermal resistances of the support structure 114 both progressively decrease at increasing distances from the heat source 106 whereas the external surface temperature of the support structure remains substantially constant across two or more regions.

Figure 3:
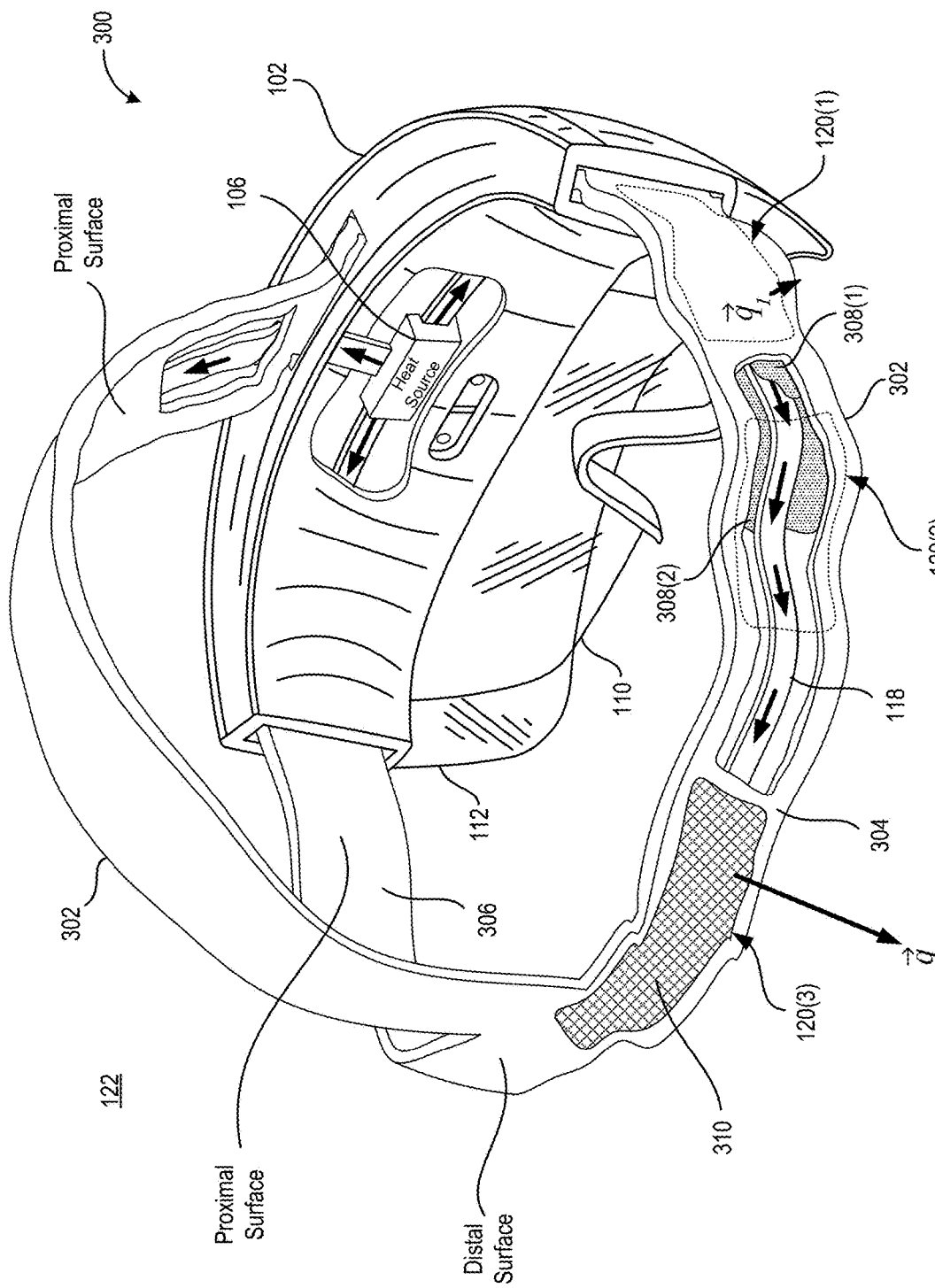
FIG. 3 is a rear perspective view of an alternate embodiment of a thermal dissipation system that is configured with one or more flexible straps to support an HMD device on a user's head.

Turning now to FIG. 3, a rear perspective view is shown of yet another alternate embodiment of a thermal dissipation system 300 that is configured with one or more flexible straps 302 to support an HMD device 102 on a user's head. Here, the flexible straps 302 have the thermal conduit 118 embedded therein to transfer heat away from the heat source 106 and, ultimately, to dissipate the heat into the ambient environment 122 through various regions 120 of the flexible straps 302.

As illustrated, the flexible straps 302 may include an outer layer 304 (or distal layer) positioned between the thermal conduit 118 and the distal surface of the flexible straps 302 and also an inner layer 306 (or proximal layer) positioned between the thermal conduit 118 and the proximal surface of the flexible straps 302. In some embodiments, a thermal resistance of the outer layer 304 is less than a thermal resistance of the inner layer 306 in order to cause heat to be dissipated at a greater rate through the outer layer 304 than through the inner layer 306.

In some embodiments, the flexible straps 302 may include a plurality of regions 120 that have different thermal resistances between the thermal conduit 118 and the ambient environment 122. In the illustrated embodiment, the flexible straps 302 include at least a first distal region through a third distal region that are labeled 120(1) through 120(3), respectively. Embedded within the flexible straps 302 at the first distal region 120(1) is a first layer of flexible insulation 308(1). Exemplary flexible insulation materials include, but are not limited to, PYROGEL® XT-E AEROGEL insulation, PYROGEL® 2250 AEROGEL insulation, and/or CRYOGEL® AEROGEL insulation all available from AEROGEL TECHNOLOGIES. Ideal properties for a chosen flexible insulation material include, but are not limited to, extremely low thermal conductivity (e.g., thermal conductivity on the order of 0.15-0.25 W/(m·K), lightweight material, and/or an ability to be easily cut and sewn into the flexible straps 302. It can be appreciated that the thermal resistance at the first distal region 120(1) is based on the combination of the thermal resistances of both of the flexible insulation 308(1) as well as the outer layer 304. In the illustrated embodiment, the first layer of the flexible insulation 308(1) does not extend through to the second distal region 120(2) of the flexible straps 302 and, therefore, the second distal region 120(2) has a thermal resistance that depends on material properties and a thickness of the outer layer 304 but is independent of the flexible insulation 308(1). Accordingly, it can be appreciated that the thermal resistance of the second distal region 120(2) is less than the thermal resistance of the first distal region 120(1).

In some embodiments, coupled to and/or embedded within the flexible straps 302 at a third region 120(3) may be a flexible heat sink 310 that is comprised of a plurality of thin flexible sheets and/or fibers of highly thermally conductive material such as, for example, one or more highly conductive metals, plastics, and/or graphite based materials. For example, the flexible heat sink 310 may be made from PYROID® HT Pyrolytic Graphite that is embedded within the flexible straps 302 to efficiently absorb heat from the thermal conduit 118 and to dissipate the absorbed heat into the ambient environment 122. In various embodiments, the outer layer 304, the inner layer 306, the thermal conduit 118, and/or any additional components of the flexible straps 302 may be enclosed within a sheathing material such as, for example, a soft flexible fabric material.

Figure 4:
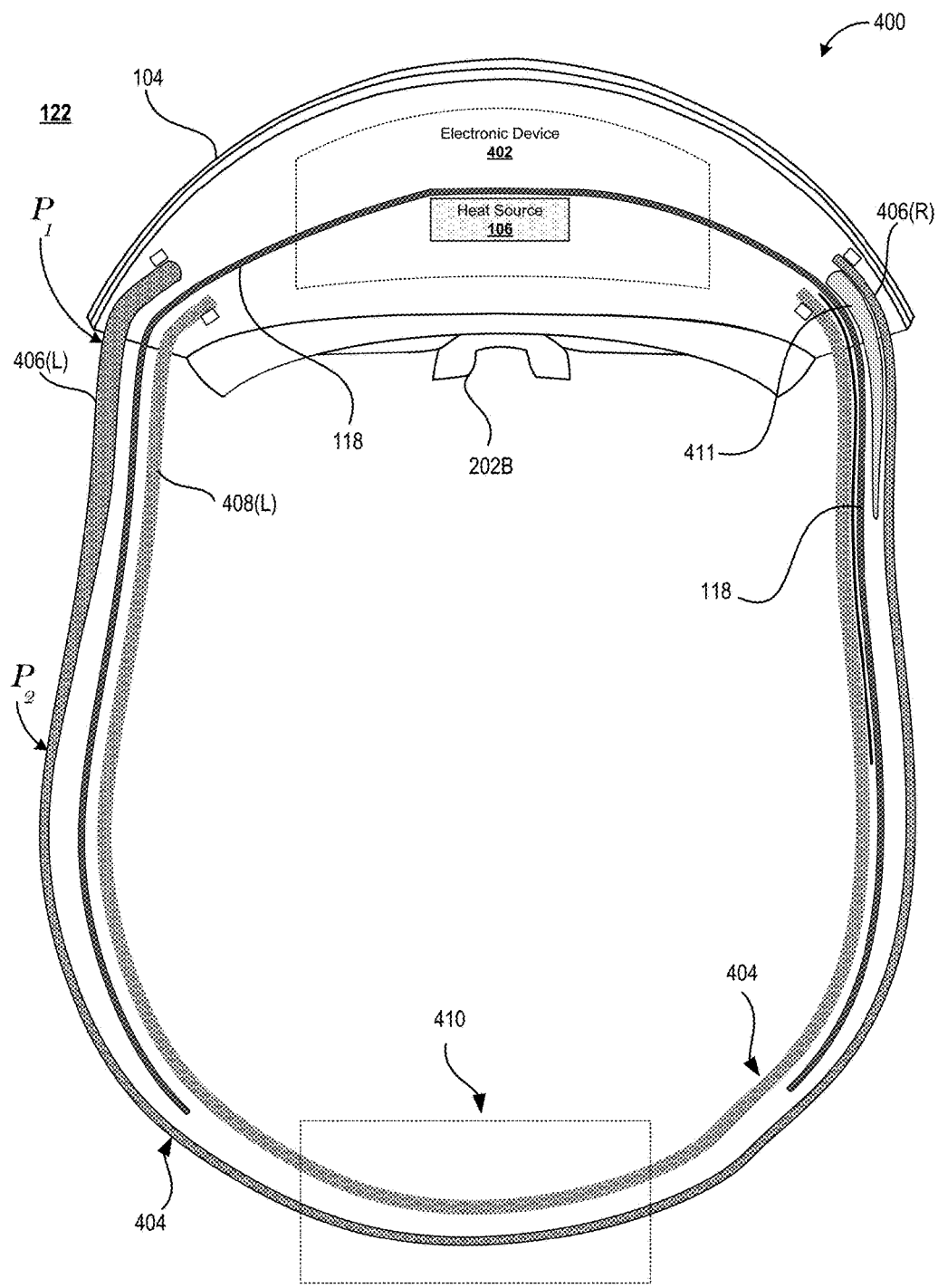
FIG. 4 is a top cross-section view of an embodiment of a thermal dissipation system that is configured with one or more flexible straps to support a wearable electronic device on a body part such as a head and/or wrist of a user.

FIG. 4 is a top cross-section view of an embodiment of a thermal dissipation system 400 that is configured with one or more flexible straps 302 to support an electronic device 402 on a body part. Although the illustrated embodiment is depicted as an HMD device such that the one or more flexible straps 302 are configured to support the electronic device 402 when on a user's head, it should be appreciated that the techniques described herein may be deployed within a large variety of wearable devices (e.g., watches and or any other type of wearable device that functions as a heat source during operation).

In some embodiments, the thermal dissipation system 400 includes a flexible strap 404 that includes one or more layers that progressively decrease in thickness at progressively further distances from the housing 104 and/or the heat source 106 enclosed therein. For example, as illustrated, the flexible strap 404 includes an outer layer 406 having a left segment 406(L) and a right segment 406(R). Here, the left segment 406(L) of the outer layer is shown to continuously decrease in thickness between a first point $P_1$ and a second point $P_2$ that is farther away from the housing 104 than the first point $P_1$. As the left segment 406(L) continuously decreases in thickness in the illustrated embodiment, it can be appreciated that in this embodiment the thermal resistance of the left segment 406(L) also continually decreases between the first point $P_1$ and the second point $P_2$. Additionally or alternatively, in some embodiments, an inner layer 408 of the flexible strap 404 decreases in thickness at further distances from the housing 104.

In some embodiments, the thermal dissipation system 400 includes an insulation layer 411 that progressively decreases in thickness in a similar fashion as described with respect to the left segment 406(L) of the flexible strap 404. As illustrated, the insulation layer 411 is disposed between the right segment 406(R) of the outer layer 406 and the thermal conduit 118 that is embedded within the flexible strap 404. Accordingly, it can be appreciated that at various implementations variations in thermal resistances between different regions of a support structure (e.g., the support structure 114 and/or the flexible straps 404) may result from a surface of the thermal conduit 118 being positioned progressively closer to at least one of a distal surface and/or a proximal surface of the support structure. As one specific but non-limiting example, the thermal conduit 118 may be a vapor chamber having one or more outer surfaces at which an internal gas may condense into a liquid upon the release of latent heat into the ambient environment 122. Here, the one or more outer surfaces of the vapor chamber may be positioned progressively closer to an outer surface of the support structure at distances further from the heat source 106 due to one or both of an outer wall 406 of the support structure and/or an insulation layer 411 decreasing in thickness.

In some embodiments, the thermal conduit 118 may extend through a first portion of the flexible strap 404 but may stop short of an adjustment region 410 that is configured to enable the flexible strap 404 to be fitted to the body part. For example, within the adjustment region 410 there may be one or more mechanical adjustment devices that enable the user to change the inner perimeter of the flexible strap 404 so that the thermal dissipation system 400 fits comfortably on the user's head when worn. As another example, within the adjustment region 410 the flexible strap 404 may include an elastic region to enable the flexible strap 404 to stretch within a range of inner parameters.

With reference to FIGS. 1 and 4, it can be appreciated that in various implementations the regions 120 can be either discrete regions (e.g., regions that discreetly change in thermal resistance at one or more particular boundaries) or continuous regions (e.g., regions having thermal resistances that continuously change based on a distance from the heat source 106). In particular, it can be appreciated that the second region 120(2) illustrated in FIG. 1 is a discrete region due to the presence of the heat sink 126 which discreetly alters the thermal properties at this region. In contrast, it can be appreciated that in FIG. 4 between points $P_1$ and $P_2$ reside regions which continuously decrease in thermal resistance based on a distance from the heat source 106.

Example Clauses

The disclosure presented herein may be considered in view of the following clauses.

Example Clause A, a wearable thermal dissipation system comprising: a housing that at least partially encloses a heat source; at least one support structure that is coupled to the housing and that is configured to maintain a position of the housing with respect to a body part, wherein the at least one support structure includes a first region having a first thermal resistance and a second region having a second thermal resistance that is less than the first thermal resistance; and a thermal conduit that is positioned to absorb heat emitted by the heat source and to transfer at least a portion of the heat through the first region having the first thermal resistance to the second region having the second thermal resistance, wherein the first region is closer to the heat source than the second region.

Example Clause B, the wearable thermal dissipation system of Example Clause A, wherein the first thermal resistance results from the first region comprising a first material having a first thermal conductivity, and wherein the second thermal resistance results from the second region comprising a second material having a second thermal conductivity that is higher than the first thermal conductivity.

Example Clause C, the wearable thermal dissipation system of any of Example Clauses A through B, wherein the first thermal resistance results from the first region comprising a first heat path distance from the thermal conduit to an ambient environment, and wherein the second thermal resistance results from the second region comprising a second heat path distance, that is less than the first heat path distance, from the thermal conduit to the ambient environment.

Example Clause D, the wearable thermal dissipation system of any of Example Clauses A through C, wherein the second region comprises a heat sink that is positioned to absorb the portion of the heat from the thermal conduit and to dissipate the portion of the heat into an ambient environment.

Example Clause E, the wearable thermal dissipation system of any of Example Clauses A through D, wherein the at least one support structure includes at least a distal surface and a proximal surface that is closer to the body part than the distal surface, and wherein the thermal conduit comprises a vapor chamber having a surface that is positioned progressively closer to at least one of the distal surface or the proximal surface at progressively further distances from the heat source.

Example Clause F, the wearable thermal dissipation system of any of Example Clauses A through E, wherein the first region having the first thermal resistance and the second region having the second thermal resistance are both distal regions of the at least one support structure.

Example Clause G, the wearable thermal dissipation system of any of Example Clauses A through F, wherein both of the at least one support structure and the thermal conduit are at least partially flexible.

While Example Clauses A through G are described above with respect to a system, it is understood in the context of this document that the subject matter of Example Clauses A through G can also be implemented by a device and/or a method of manufacturing.

Example Clause H, a wearable device comprising: a housing that includes a heat source; a thermal conduit having at least a first segment that is positioned to absorb heat emitted by the heat source and a second segment to transfer at least a portion of the heat that is emitted from the heat source away from the housing; at least one support structure that is coupled to the housing and that at least partially encloses the second segment of the thermal conduit within a plurality of regions that are positioned progressively further from the housing, wherein the plurality of regions comprises at least one of a plurality of thermal conductivities or a plurality of material thicknesses to produce a plurality of thermal resistances between the thermal conduit and an ambient environment.

Example Clause I, the wearable device of Example Clause H, wherein the plurality of regions comprises a plurality of discrete regions and the plurality of thermal resistances comprises a plurality of discrete thermal resistances, wherein individual regions of the plurality of discrete regions correspond to individual thermal resistances of the plurality of discrete thermal resistances.

Example Clause J, the wearable device of Example Clause I, wherein the plurality of discrete regions comprises: a first region that is configured with a first thermal resistance to insulate the ambient environment from the portion of the heat, and a second region that comprises a heat sink that is configured with a second thermal resistance that is lower than the first thermal resistance, wherein the heat sink is thermally coupled to the thermal conduit to dissipate the portion of the heat into the ambient environment.

Example Clause K, the wearable device of any of Example Clauses H through J, wherein at least some of the plurality of thermal resistances progressively decrease as the plurality of regions are positioned progressively further from the housing.

Example Clause L, the wearable device of Example Clause K, wherein the plurality of thermal resistances that progressively decrease further from the housing are selected, based on a predetermined thermal output of the heat source and one or more predetermined conditions of the ambient environment, to maintain at least one surface corresponding to the plurality of regions at or below a predetermined surface temperature.

Example Clause M, the wearable device of any of Example Clauses H through L, further comprising a flexible heat sink that is positioned to absorb the portion of the heat from the thermal conduit and is configured to dissipate the portion of the heat into the ambient environment.

Example Clause N, the wearable device of any of Example Clauses H through M, wherein the at least one support structure comprises a flexible strap that is configured to maintain a position of the housing with respect to a body part.

Example Clause O, the wearable device of Example Clause N, wherein the flexible strap comprises at least one insulation layer that progressively decreases in thickness at progressively farther distances from the housing.

Example Clause P, the wearable device of any of Example Clauses H through O, wherein the at least one support structure includes at least two temple-arms that are each configured to extend at least partially over the ears of the user to maintain at least one display, that is coupled to the housing, at a predetermined position with respect to at least one eye of the user.

While Example Clauses H through P are described above with respect to a wearable device, it is understood in the context of this document that the subject matter of Example Clauses H through P can also be implemented by a system and/or a method of manufacturing.

Example Clause Q, a head-mounted display device comprising: a display assembly at least partially enclosing one or more electronic components that emit heat during operation, wherein the display assembly includes a display component to generate images in front of an eye of a user; at least one support assembly that is coupled to the display assembly and that is configured to mount the display assembly to a head of the user, wherein the at least one support assembly comprises a first region that includes a first material having a first thermal conductivity and a second region that includes a second material having a second thermal conductivity, wherein the first region is closer to the one or more electronic components than the second region; and a thermal conduit that is positioned to absorb the heat emitted by the one or more electronic components and to transfer at least some of the heat through the first region to the second region, wherein the first thermal conductivity results in the first region having a first thermal resistance from the thermal conduit to an ambient environment, and wherein the second thermal conductivity results in the second region having a second thermal resistance, from the thermal conduit to the ambient environment, that is less than the first thermal resistance.

Example Clause R, the head-mounted display device of Example Clause Q, wherein the thermal conduit is a vapor chamber that includes at least a bi-phase fluid and a wicking structure.

Example Clause S, the head-mounted display device of any of Example Clauses Q through R, wherein a difference between the first thermal resistance and the second thermal resistance results in a first heat flux corresponding to the first region being less than a second heat flux corresponding to the second region during operation of the one or more electronic components.

Example Clause T, the head-mounted display device of any of Example Clauses Q through S, wherein the difference between the first thermal resistance and the second thermal resistance results in a first surface temperature corresponding to the first region being less than a second surface temperature corresponding to the second region during operation of the one or more electronic components.

While Example Clauses Q through T are described above with respect to a device, it is understood in the context of this document that the subject matter of Example Clauses Q through T can also be implemented by a system and/or a method of manufacturing.

In closing, although the various techniques have been described in language specific to structural features and/or methodological acts, it is to be understood that the subject matter defined in the appended representations is not necessarily limited to the specific features or acts described. Rather, the specific features and acts are disclosed as example forms of implementing the claimed subject matter.

What is claimed is:

1. A wearable thermal dissipation system comprising:
   a housing that at least partially encloses one or more electronic components that emit heat during operations;
   at least one support structure that is coupled to the housing and that is configured to maintain a position of the housing with respect to a body part, wherein the at least one support structure includes a first region and a second region that is farther from the one or more electronic components than the first region; and
   a thermal conduit that is positioned to absorb the heat emitted by the one or more electronic components and to transfer at least a portion of the heat through the first region to the second region, wherein one or more first properties of the first region result in the first region having a first thermal resistance from the thermal conduit to an ambient environment, and wherein one or more second properties of the second region result in the second region having a second thermal resistance from the thermal conduit to the ambient environment.

2. The wearable thermal dissipation system of claim 1, wherein the first thermal resistance results from the first region comprising a first material having a first thermal conductivity, and wherein the second thermal resistance results from the second region comprising a second material having a second thermal conductivity that is higher than the first thermal conductivity.

3. The wearable thermal dissipation system of claim 1, wherein the first thermal resistance results from the first region comprising a first heat path distance from the thermal conduit to an ambient environment, and wherein the second thermal resistance results from the second region comprising a second heat path distance, that is less than the first heat path distance, from the thermal conduit to the ambient environment.

4. The wearable thermal dissipation system of claim 1, wherein the second region comprises a heat sink that is positioned to absorb the portion of the heat from the thermal conduit and to dissipate the portion of the heat into an ambient environment.

5. The wearable thermal dissipation system of claim 1, wherein the at least one support structure includes at least a distal surface and a proximal surface that is closer to the body part than the distal surface, and wherein the thermal conduit comprises a vapor chamber having a surface that is positioned progressively closer to at least one of the distal surface or the proximal surface at progressively further distances from the heat source.

6. The wearable thermal dissipation system of claim 1, wherein the first region having the first thermal resistance and the second region having the second thermal resistance are both distal regions of the at least one support structure.

7. The wearable thermal dissipation system of claim 1, wherein both of the at least one support structure and the thermal conduit are at least partially flexible.

8. A wearable device comprising:
a housing that includes a heat source;
a thermal conduit having at least a first segment that is positioned to absorb heat emitted by the heat source and a second segment to transfer at least a portion of the heat that is emitted from the heat source away from the housing;
at least one support structure that is coupled to the housing and that at least partially encloses the second segment of the thermal conduit within a plurality of regions that have varying properties that result in a plurality of thermal resistances between the thermal conduit and an ambient environment, wherein the varying properties include at least one of: varying thermal conductivities across at least some of the plurality of regions, or varying material thicknesses across at least some of the plurality of regions.

9. The wearable device of claim 8, wherein the plurality of regions comprises a plurality of discrete regions and the plurality of thermal resistances comprises a plurality of discrete thermal resistances, wherein individual regions of the plurality of discrete regions correspond to individual thermal resistances of the plurality of discrete thermal resistances.

10. The wearable device of claim 9, wherein the plurality of discrete regions comprises:
a first region that is configured with a first thermal resistance to insulate the ambient environment from the portion of the heat, and
a second region that comprises a heat sink that is configured with a second thermal resistance that is lower than the first thermal resistance, wherein the heat sink is thermally coupled to the thermal conduit to dissipate the portion of the heat into the ambient environment.

11. The wearable device of claim 8, wherein at least some of the plurality of thermal resistances progressively decrease as the plurality of regions are positioned progressively further from the housing.

12. The wearable device of claim 11, wherein the plurality of thermal resistances that progressively decrease further from the housing are selected, based on a predetermined thermal output of the heat source and one or more predetermined conditions of the ambient environment, to maintain at least one surface corresponding to the plurality of regions at or below a predetermined surface temperature.

13. The wearable device of claim 8, further comprising a flexible heat sink that is positioned to absorb the portion of the heat from the thermal conduit and is configured to dissipate the portion of the heat into the ambient environment.

14. The wearable device of claim 8, wherein the at least one support structure comprises a flexible strap that is configured to maintain a position of the housing with respect to a body part.

15. The wearable device of claim 14, wherein the flexible strap comprises at least one insulation layer that progressively decreases in thickness at progressively farther distances from the housing.

16. The wearable device of claim 8, wherein the at least one support structure includes at least two temple-arms that are each configured to extend at least partially over the ears of the user to maintain at least one display, that is coupled to the housing, at a predetermined position with respect to at least one eye of the user.

17. A head-mounted display device comprising:
a display assembly at least partially enclosing one or more electronic components that emit heat during operation, wherein the display assembly includes a display component to generate images in front of an eye of a user;
at least one support assembly that is coupled to the display assembly and that is configured to mount the display assembly to a head of the user, wherein the at least one support assembly comprises a first region that includes a first material having a first thermal conductivity and a second region that includes a second material having a second thermal conductivity, wherein the first region is closer to the one or more electronic components than the second region; and
a thermal conduit that is positioned to absorb the heat emitted by the one or more electronic components and to transfer at least some of the heat through the first region to the second region, wherein the first thermal conductivity results in the first region having a first thermal resistance from the thermal conduit to an ambient environment, and wherein the second thermal conductivity results in the second region having a second thermal resistance, from the thermal conduit to the ambient environment, that is less than the first thermal resistance.

18. The head-mounted display device of claim 17, wherein the thermal conduit is a vapor chamber that includes at least a bi-phase fluid and a wicking structure.

19. The head-mounted display device of claim 17, wherein a difference between the first thermal resistance and the second thermal resistance results in a first heat flux corresponding to the first region being less than a second heat flux corresponding to the second region during operation of the one or more electronic components.

20. The head-mounted display device of claim 17, wherein the difference between the first thermal resistance and the second thermal resistance results in a first surface temperature corresponding to the first region being less than a second surface temperature corresponding to the second region during operation of the one or more electronic components.

\* \* \* \* \*